United States Patent [19]

Kao et al.

[11] Patent Number: 4,572,947
[45] Date of Patent: Feb. 25, 1986

[54] TRIGGERING METHOD FOR LIGHT TRIGGERED THYRISTORS

[75] Inventors: Yu C. Kao, Pittsburgh; Scott G. Leslie, Penn Hills, both of Pa.

[73] Assignee: Westinghouse Electric Corp., Pittsburgh, Pa.

[21] Appl. No.: 615,019

[22] Filed: May 29, 1984

[51] Int. Cl.[4] ............... H01L 11/14; H01J 39/12
[52] U.S. Cl. ............... 250/211 J; 338/17; 338/18; 357/30
[58] Field of Search ............ 250/211 J; 338/17, 18; 357/30

[56] References Cited

U.S. PATENT DOCUMENTS 3,459,944  8/1969  Triebwasser ............... 250/211 J

Primary Examiner—John D. Welsh
Attorney, Agent, or Firm—C. L. Menzemer

[57] ABSTRACT

The present invention provides a method for triggering a light triggered thyristor (LT[2]) which method comprises using a light source to provide background excitation of carriers in at least the amplifying gate areas of the LT[2] prior to triggering the device. The background excitation is of a low level and will not trigger the device or cause excessive leakage current. At the desired time a second light signal is used to trigger the LT[2].

6 Claims, 1 Drawing Figure

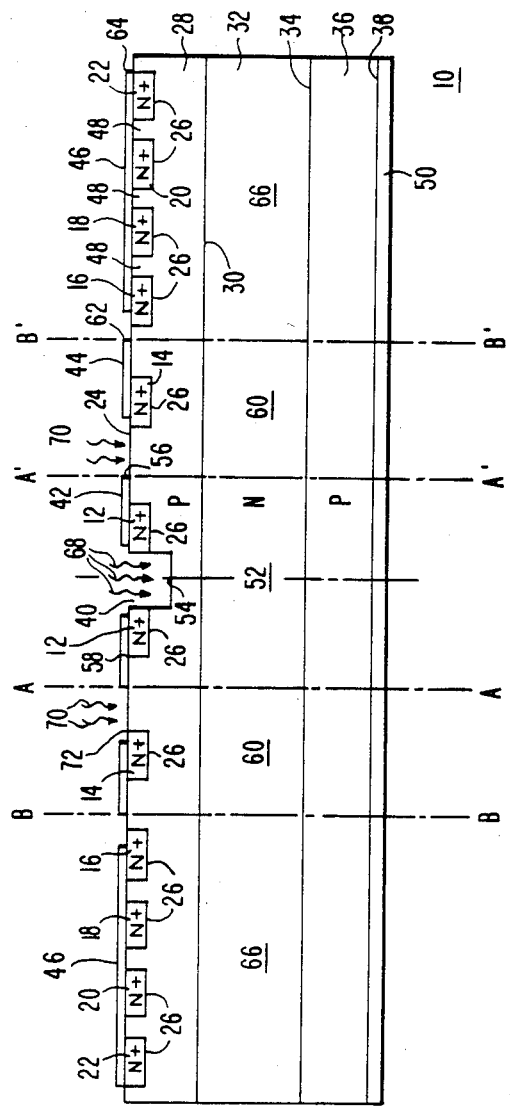

TRIGGERING METHOD FOR LIGHT TRIGGERED THYRISTORS

BACKGROUND OF THE INVENTION

1. Field of the Invention

The present invention is in the field of light triggered thyristors generally and is specifically directed to a method of firing or triggering such devices.

2. Description of Prior Art

It is well known to fire or trigger a light triggered thyristor (LT²) by switching the LT² from the blocking state to the conducting state with light energy.

A LT² will generally have a photocathode region, an amplifying gate region and a main cathode region.

When the triggering light strikes the photocathode region, the photocurrent "turns on" the photocathode region first. The resulting current passing through the photocathode in turn triggers or "turns on" the amplifying gate region and the main cathode region.

SUMMARY OF THE INVENTION

The present invention is directed to a method for firing or triggering light fired thyristor (LT²), said LT² having a photocathode area, an amplifying gate area and a main cathode area said photocathode area containing an optical well, said method comprising first exciting carriers in at least the amplifying gate area with light energy from a first light source and thereafter triggering the LT² with light energy from a second light source directed at the optical well.

DESCRIPTION OF THE FIGURE

For a better understanding of the present invention reference should be had to the following detailed description and drawings the single FIGURE of which:

is a side view of a light triggered thyristor capable of being fired in accordance with the teachings of this invention;

DESCRIPTION OF PREFERRED EMBODIMENT

With reference to FIG. 1, there is shown a light triggered thyristor (LT²) 10 suitable for being fired in accordance with the teachings of this invention.

For the purpose of describing the present invention, it will be assumed that the LT² 10 is built in a circular wafer or hyperpure, single crystal silicon having a diameter of 50.8 mm (2 inches) and a height of 0.920 mm. The LT² is designed to be fired with a minimum of 5 milli-watts of power and to be rated at 4000 volts blocking voltage.

It will of course be appreciated that the present invention is equally applicable to LT²'s of any physical size and designed firing power.

The LT² 10 has a plurality of n+ type ring shaped cathode emitter regions 12, 14, 16, 18, 20 and 22 disposed therein. Each of the cathode emitter regions extend from top surface 24 of the LT² 10 into the LT² to a depth of 15 microns. Each of the cathode emitter regions 12, 14, 16, 18, 20 and 22, which are preferably formed by diffusion, are doped to a surface concentration of $10^{20}$ atoms/cc at surface 24 and decrease to a doping concentration of $5 \times 10^{16}$ at pn junction 26.

The emitters are formed or disposed in p type cathode base region 28. The cathode region 28 has a width of 100microns as measured from top surface 24 to pn junction 30, and a width of 85 microns as measured from pn junction 26 to pn junction 30.

The p type cathode base region 28, preferably formed by diffusion, has a surface doping concentration, at surface 24, of $10^{18}$ atoms/cc.

An n type anode base region 32 is adjacent to p type cathode base region 28. The anode region 32, a portion of the original silicon wafer has a width of 720 microns as measured between pn junction 30 and pn junction 34 and is doped to a concentration of $10^{13}$ atoms/cc.

P-type anode emitter region 36 is adjacent to anode base region 32. Anode emitter region 36 has a width of 100 microns as measured between pn junction 34 and bottom surface 38 and is doped to a surface concentration; at bottom surface 38, of $10^{18}$ atoms/cc.

An optical well 40 is disposed in the center of top surface 24 of LT² 10. The optical well has a diameter of 1.5 mm and extends from top surface 24 into the cathode base region 28 to a depth of from 30 to 50 μm. The optical well 40 is surrounded by cathode emitter region 12.

A metallic electrode 42, preferably of aluminum, is in electrical ohmic contact with cathod emitter region 12 and extends across that portion of p-n junction 26 between region 12 and region 28 and is also in ohmic electrical contact with region 28.

Another metallic electrode 44, preferably of aluminum, is in ohmic electrical contact with cathode emitter region 14 and cathode base region 28.

Still another metallic electrode 46, preferably of aluminum, is in ohmic electrical contact with cathode emitter regions 16, 18, 20 and 22 and with segments 48 of cathode base region 28 which extend to top surface 24 of LT² 10 between the cathode emitter regions 16, 18, 20 and 22.

The metallic electrodes 42, 44 and 46 will normally have a thickness of 10 microns.

An electrode 50 is affixed to bottom surface 38 of the LT² 10 in ohmic electrical contact with anode emitter region 36. The electrode 50 is preferably of molybdenum and has a thickness of 2500 microns.

The LT² 10 can functionally be divided into three parts.

The central part, defined by the dotted lines AA', is a photocathode area 52. The photocathode area is of a circular configuration with its center point 54 at the center of the optical well and its circumference defined by outer edge 56 of electrode 42. In this particular device the photocathode area has a diameter of 4 mm. The distance from point 54 to point 58 at the outer edge of cathode emitter region 12 is 1.5 mm.

A ring shaped portion 60, defined as the area between lines AA-BB and A'A'-B'B', the distance from point 56 to point 62 at outside edge of electrode 44, is the amplifying gate area. The distance between lines AA' and BB' is 1.683 mm.

The remainder of the device, as measured from point 62 to point 64, the outside edge of electrode 46 comprises main cathode 66.

Normally in triggering the present device, which as stated above is capable of being triggered by 5 milliwatts, light from a suitable source, for example from a light emitting diode or a laser diode is directed into at least the optical well 40. Such light is denoted by arrows 68 in the figure. While the triggering light is normally directed into the optical well, it may be directed over the whole photocathode area and in some case additionally over the amplifying gate area.

While the LT² 10 is capable of being triggered by 5 milliwatts of power, it is common to trigger the LT² device with as much as 10 times the minimum triggering power, in this case 50 milliwatts of power. The additional power will cause the LT² to turn on faster up to a certain point where due to the delay in the amplifying gate stage additional power will have no effect on "turn-on" or triggering time.

The present invention provides that prior to firing the LT² with the light denoted by arrows 68 a light source, designated by arrows 70 in the FIGURE, is used to provide background excitation of carriers at least in the amplifying gate area.

The background excitation may be accomplished by directing the background excitation light at (1) only the amplifying gate area; (2) at the amplifying gate area and the photocathode area; or (3) at the amplifying gate area, the photocathode area and the main cathode area.

It should be appreciated that the more extensive the area struck by the background exciting light, the more leakage current generated. Therefore, the amount of leakage current that can be tolerated in the LT² is a controlling factor in determining which areas are excited in addition to the amplifying gate area.

The background excitation light has a low level of power and is not capable of triggering the LT² nor cause excessive leakage currents but has enough power to activate the pnp transistor comprised of p-type region 36, emitter, n-type region 32, base, and p-type region 28, collector in both the photocathode area and the amplifying gate area. Normally, the excitation lights power level is 10%/mm² of the minimum light power needed to trigger the LT².

In the FIGURE the light causing the background excitation is shown striking top surface 24 of the LT² 10 between outer edge 56 of electrode 42 and edge 72 of cathode emitter 14. This area is the amplifying gate area immediately adjacent to the photocathode area.

The amount of light for background excitation is dependent on the area of the amplifying gate stage. In this example it has been found that 2.5 milliwatts per square millimeter of area of the amplifying gate stage is desired. In this device the area is 75 mm² and the light energy employed is 187.5 milliwatts. If the amount of light greatly exceeds this high leakage currents result. If the amount of light is appreciably less than this no benefit is realized.

The background enhancement light is activated first, then when the LT² is to be triggered, a second light signal is applied at the optical well 40 to trigger the photocathode 52.

Since the pnp transistor is already activated, by the enhancement light, the amplifying gate region comes on quickly after the photocathode is on. The rapid shift of current from the photocathode to the amplifying area prevents the destruction of the photocathode due to high di/dt. If the initial "turn on" length of the amplifying gate is lengthened, the di/dt capability can be increased.

The background excitation can be applied as a constant light as discussed above, or in pulses. If applied in pulse, the power, 2.5 milliwatt/mm² must be applied at least five transit times, or carrier lifetime, in the n-base, region 32, prior to applying the gate pulse, because it takes a period of several lifetimes to fully activate the pnp transistor.

This method of triggering can also be used to provide self-protection for the LT² 10 against overvoltage or excessive rate of rise. Using a sensor to detect voltage and the rate of rise of voltage, a signal can increase the energy level of the light source so that the devices can be triggered prior to reaching the destruction conditions or overvoltage or excessive dv/dt.

The invention can also be used for high energy pulse power applications. With the pnp transistor activated first, the LT² will switch much faster on command.

In addition, a low energy large area illumination will lead to a large area "turn-on" thus yielding very high current response.

We claim as our invention:

1. A method for triggering a light fired thyristor, said light fired thyristor having a photocathode area, an amplifying gate area and a main cathode area, said photocathode area having walls forming an optical well therein, said method comprising exciting carriers in at least the amplifying gate area with light energy, of a predetermined power level, from a first light source, said light energy from said first light source being incapable of triggering the light fired thyristor and thereafter triggering the light fired thyristor by directing light energy from a second light source at at least the optical well.

2. The method of claim 1 in which carriers are excited in the photocathode area and the amplifying gate area by light from the first light source.

3. The method of claim 1 in which carriers are excited in the photocathode, the amplifying gate area and the main cathode area by light from the first light source.

4. The method of claim 1 in which the light energy from the first light source is 10%/mm² of the minimum light energy required to fire the LT².

5. The method of claim 1 in which the light energy from the first light source is applied to the light fired thyristor as a constant light.

6. The method of claim 1 in which the light energy from the first light source is applied to the light fired thyristor in a series of pulses.

* * * * *